US006860973B2

(12) United States Patent
Willms et al.

(10) Patent No.: US 6,860,973 B2
(45) Date of Patent: Mar. 1, 2005

(54) DEVICE FOR THE REGULATION OF A PLASMA IMPEDANCE

(75) Inventors: Thomas Willms, Castrop-Rauxel (DE); Jürgen Bruch, Nidderau (DE)

(73) Assignee: Applied Films GmbH & Co. KG., Alzenau (DE)

( * ) Notice: Subject to any disclaimer, the term of this patent is extended or adjusted under 35 U.S.C. 154(b) by 184 days.

(21) Appl. No.: 10/287,452

(22) Filed: Nov. 4, 2002

(65) Prior Publication Data

US 2003/0087044 A1 May 8, 2003

(30) Foreign Application Priority Data

Nov. 7, 2001 (DE) .......................................... 101 54 229

(51) Int. Cl.$^7$ .......................... C23C 14/34; C23C 16/00
(52) U.S. Cl. ............................ 204/192.13; 204/192.12; 204/298.03; 204/298.08; 118/663; 427/8; 156/345.28; 156/345.24
(58) Field of Search ...................... 204/192.12, 192.13, 204/298.03, 298.08; 118/663, 723 E, 723 ER, 723 I, 723 IR; 427/8, 569; 156/345.28, 345.24

(56) References Cited

U.S. PATENT DOCUMENTS

| 4,500,408 A | 2/1985 | Boys et al. |
|---|---|---|
| 5,169,509 A | 12/1992 | Latz et al. |
| 5,292,417 A | 3/1994 | Kugler |
| 5,807,470 A | 9/1998 | Szczyrbowski et al. |
| 6,511,584 B1 * | 1/2003 | Szczyrbowski et al. ..... 204/192.22 |
| 6,685,797 B2 * | 2/2004 | Matsumoto et al. ... 156/345.24 |

FOREIGN PATENT DOCUMENTS

| DE | 34 25 659 A1 | 1/1985 |
|---|---|---|
| DE | 41 06 770 A1 | 9/1992 |
| DE | 195 37 212 A1 | 4/1996 |
| DE | 101 54 229 B4 | 5/2003 |
| EP | 0 508 359 A1 | 10/1992 |
| EP | 0 795 890 A1 | 9/1997 |

OTHER PUBLICATIONS

Balance control for Reactive Magnetron . . . Coating, Strumpfel, pp. 79–84, (2001).

High Power Generators or Medium . . . Applications, Rettich, et al., Journal of Non–Crystalline Solids 218 (1997) 50–53 MF Sputtering—A Powerful Process . . . Coating, Rettich, et al., 1999 Society of Vacuum Coaters (505/856–7188 (1999).

* cited by examiner

Primary Examiner—Rodney G. McDonald
(74) Attorney, Agent, or Firm—Fulbright & Jaworski, L.L.P.

(57) ABSTRACT

The invention relates to a device for the regulation of a plasma impedance in a vacuum chamber, wherein at least one electrode is connected to an AC generator. This AC generator is a free-running [oscillator], whose frequency adjusts to the resonance frequency of the load upon which it acts. This load comprises fixed circuit elements and a variable plasma impedance. If the plasma impedance is changed, with it the resonance frequency is also changed. The plasma impedance can thus be varied by acquisition of the resonance frequency and by presetting of a reference frequency value, for example thereby that the voltage, the current, the power or the gas inflow is varied as a function of the difference between resonance frequency and reference frequency value.

8 Claims, 3 Drawing Sheets

DEVICE FOR THE REGULATION OF A PLASMA IMPEDANCE

FIELD OF THE INVENTION

The invention relates to a device for the regulation of a plasma impedance.

BACKGROUND AND SUMMARY OF THE INVENTION

For the etching and vapor deposition of substrates very often the so-called sputter technique is employed, in which in a vacuum chamber at low pressure the ions of a gas are accelerated onto electrodes, where they knock out particles, which subsequently coat or etch a substrate. Acceleration of the gas ions takes place either by means of a DC or an AC voltage, which is applied to the substrate and to the electrodes.

If an AC voltage is applied, the entire electric circuit comprises as a rule an AC voltage source, a network and a plasma impedance, i.e. of the impedance between the electrodes or between an electrode and the substrate, respectively. While the network as a rule has constant electric structural elements, which do not vary during operation, the plasma impedance can vary thereby that the fraction of ions and/or electrons varies relative to the electrically neutral particles.

If one wishes to attain a high sputtering rate during reactive medium frequency sputtering, it is necessary to operate in the transition range between metallic and fully reactive mode. Operation is to remain stable therein. However, in the case of high powers and/or cathode spacings a stable operation transition range is often difficult of attainment since an uncontrolled toggling from the metallic into the fully reactive mode occurs readily.

It is known that the impedance before the ignition of the plasma is of approximately infinite magnitude and, after the ignition, as a function of the operating point adjusts to a value of >0 Ω. It is furthermore known that the above described system composed of AC voltage source, network and plasma impedance represents a resonant circuit, whose resonance frequency varies with the plasma impedance (Society of Vacuum Coaters, Konferenzbeitrag Hüttinger Elektronik, 1999). Means, with which stable sputtering operation can be achieved, are not specified in this publication. Rather, only the state is described which adjusts under unregulated conditions with the presetting of the process parameters 'power and gas flows'. This state defines a specific operating point at a specific plasma impedance and therewith a specific resonance frequency.

Furthermore is known a device for regulating a sputter installation in which the electric impedance of the plasma takes place by regulating the strength of the magnetic field (DE 34 25 659 A1). However, herein the feeding of the cathode takes place with DC voltage.

In another known method for coating a substrate by means of a sputter device the operating point is to be stabilized rapidly and simply (EP 0 795 890 A2). The electric power supplied to the sputtering electrode swings between two values. The power values L are selected such that at like reactive gas inflow the target of the sputtering electrode is in metallic mode during the first power value, while during the second power value, it is in oxidic mode. Regulation of the plasma impedance does not take place in this method.

Stabilization of a medium frequency sputter process without external regulation, in which the network matching is selected such that the disturbances are being counteracted, is also known (DE 195 37 212 A1=U.S. Pat. No. 5,807,470).

In addition, a method and an installation for coating at least one object with at least one layer is known, in which an ohmically conducting target is sputtered in a glow discharge operated by means of DC and AC superimposed onto it (EP 0 508 359 A1). The coating process is therein operated in unstable transition mode between metallic and reactive mode. Through the regulation this process is stabilized in unstable transition mode and specifically in transition mode in proximity to the transition into the metallic mode. As manipulated variable in the automatic control system the DC signal and/or the frequency of the DC signal and/or the frequency and/or the amplitude of the DC signal are employed. The instantaneous value acquisition is carried out through an optical method, in particular through absorption and/or fluorescence spectroscopy. Such instantaneous value acquisition requires relative high effort and expenditures.

In another known method for the reactive coating of a substrate, the frequency of the AC source during the sputter process is set such that the ions can still follow the AC field, which, at a frequency of approximately 1 kHz to 100 kHz, is the case (DE 41 06 770 A1). With the aid of a voltage effective value acquisition a tapped-off discharge voltage is supplied as DC voltage to a regulator, which, in turn, drives a magnetic valve for the supplying of a quantity of reactive gas and specifically such that the measured voltage governs the required reactive gas quantity. Thus, at constant AC frequency a voltage is measured, which, in turn, fixes the reactive gas measurement.

Furthermore a balance regulation for reactive magnetron sputtering for the optical large-area coating is known, in which the instability of the transition range between the metallic operating range and the oxidic operating range is decreased or eliminated through regulation (C. May and J. Strümpfel: Balanceregelung für reaktives Magnetronsputtern zur optischen Großflächenbeschichtung, Vakuum in Forschung und Praxis, 2001, No. 2, pp. 79 to 84). For the instantaneous value acquisition the optical spectroscopy, partial pressure measurement and plasma impedance are drawn on herein. The regulation of the plasma impedance takes place via the discharge voltage, which is required for maintaining the power kept constant by a medium frequency current supply. However, a frequency variation of the voltage does not take place.

Lastly, a high-power generator for the medium frequency sputtering with double magnetron is also known, which ensures high power stability and matching to different load impedances (T. Rettich, P. Wiedemuth: High power generators for medium frequency sputtering applications, Journal of Non-Crystalline Solids 218, 1997, pp. 50 to 53). This oscillator comprises a resonance circuit and can provide voltages of 300 V up to more than 1200 V. Its frequency range extends from 20 to 100 kHz. The particular optimum frequency is set as a function of the material to be sputtered. Corresponding to a special layout of the free running oscillator the reaction to load fluctuations takes place within one halfwave. Load changes result immediately in frequency changes whereby a mismatch is avoided. This frequency change, however, is not utilized as a measuring value for the instantaneous value acquisition of the system impedance to be regulated.

The invention addresses the problem of providing a regulating device with which the process conditions can be kept constant.

This problem is solved according to the present invention, which relates in part to a device for the regulation of a plasma impedance, comprising a vacuum chamber, at least one electrode disposed in said vacuum chamber, said at least one electrode connected to an AC generator, wherein into the vacuum chamber a process gas can be introduced, wherein said AC generator is a free-running AC generator whose frequency adjusts to the resonance frequency of the circuitry connected to it, a reference frequency value sender, a parameter regulating device, which as a function of the difference between reference and instantaneous frequency value, regulates a parameter which affects the plasma impedance.

The invention, consequently, relates to a device for regulating a plasma impedance in a vacuum chamber, wherein at least one electrode is connected to an AC generator. This AC generator is a free running [oscillator] whose frequency adjusts to the resonance frequency of the load upon which it acts. This load consists of fixed switching elements and of a variable plasma impedance. If the plasma impedance changes, the resonance frequency also changes with it. The plasma impedance can thus be varied by acquisition of the resonance frequency and by presetting of a nominal frequency value, for example, thereby that the voltage, the current, the power or the gas inflow is varied as a function of the difference between resonance frequency and nominal frequency value.

One advantage attained with the invention comprises that the regulation suffices without a sensor, for example an optical sensor, a λ-probe or a mass spectrometer, with which the plasma state is established. A further advantage comprises that $Si_3N_4$ processes can be regulated. In addition, the operating point of the plasma process is exactly maintained.

Embodiment examples of the invention are depicted in the drawings and will be described in further detail.

DETAILED DESCRIPTION

Figure 1:
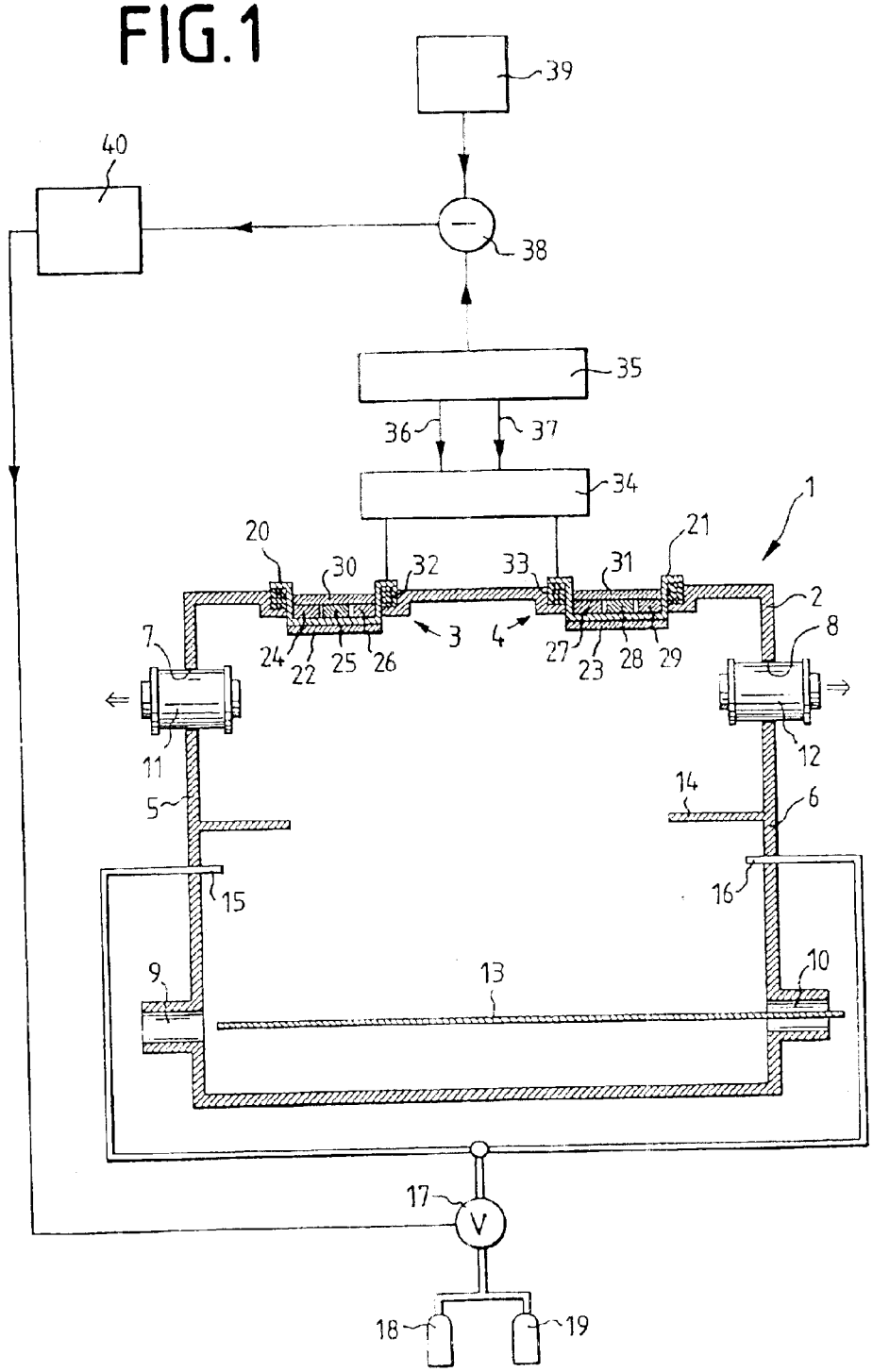
FIG. 1 is a first embodiment of the invention, in which the impedance is regulated by controlling the inflow of process and/or reactive gas.

In FIG. 1 is depicted a sputter installation 1 which comprises a vacuum chamber 2 in which are disposed two magnetrons 3, 4. In side walls 5, 6 of the vacuum chamber 2 upper openings 7, 8 and lower openings 9, 10 are provided, and vacuum pumps 11, 12 are disposed in the upper openings 7, 8 while the lower openings 9, 10 serve for interlocking a substrate 13, for example a glass plate, through the vacuum chamber 2. Between the lower openings 9, 10 and the upper openings 7, 8 is disposed a mask 14 which projects from the side walls 5, 6 into the interior of the vacuum chamber 2. Beneath this mask 14 are located gas supply lines 15, 16 which are connected via a valve 17 with gas containers 18, 19.

Each magnetron 3, 4 comprises a cathode pan 20, 21, which is provided with a target 22, 23 on its underside. In the cathode pans 20, 21 are disposed in each instance three permanent magnets 24, 25, 26 or 27, 28, 29, respectively, with are connected with a common yoke 30, 31.

The cathode pans 20, 21 are fit into place via seals 32, 33 into the upper side of the vacuum chamber 2. Both cathode pans 20, 21 are connected to an electric filter 34, which is connected to a medium frequency generator 35. This medium frequency generator 35 is not a fixed frequency oscillator or a tunable oscillator but rather a free running oscillator, whose frequency always agrees with the resonance frequency of the network connected to it. This free running [oscillator] can, in detail, be comprised of an H-AC inverter circuit comprising four IGBT modules, which circuit operates on the network and the plasma impedance. The AC inverter circuit is fed via a DC intermediate circuit in the medium frequency generator 35. This is at floating potential. A control electronics [system] ascertains via current and voltage measuring in the output of the AC inverter the resonance frequency of the oscillation-capable output and with it controls the IGBT module. The type of AC inverter circuit as well as the resonant driving in the case of medium frequency supplies is known (Generator by the firm H üttinger or by the firm EMA-Indutec).

The network is comprised within the medium frequency generator 35 of an oscillator circuit, an output transformer and outside of the generator of supply lines 36, 37, the capacitance and inductance of the filter 34 and of the plasma impedance. The network has the property to increase the stability of the process by suppressing current transients. Furthermore, with the network the impedance value, at which power matching is present, can be varied which can contribute to the operating point stabilization.

In the embodiment example of FIG. 1 by plasma impedance is understood the AC resistance of the plasma between the two magnetrons 3, 4. If only one magnetron were provided, the plasma impedance would be between this magnetron and the substrate or another site at which the second polarity of the AC current is connected. Since the total impedance, with which the medium frequency generator 35 is loaded, is constant except for the plasma impedance, the resonance frequency, and therewith the frequency with which the medium frequency generator 35 oscillates, is governed by the plasma impedance. The particular instantaneous frequency of the medium frequency generator 35 corresponds therewith to the resonance frequency of the entire circuit and consequently is a function of the plasma impedance. The instantaneous frequency is supplied to a comparator 38, to which is also supplied a reference frequency from a reference frequency sender 39. The reference frequency thus corresponds to a feedback engineering control input.

The difference between instantaneous and reference frequency value is supplied to a regulator 40, which forms from this difference a control signal for a valve 17. The regulator 40 can be a PI, a PID or a software fuzzy regulator with matched regulator characteristic. If the frequency of the free-running medium frequency generator 35 is changed due to a change of the plasma impedance, through the difference former 38 a difference between the current instantaneous value and the reference value is formed from the reference value sender and conducted to the regulator 40. This generates hereupon a regulator signal, which acts counter to the frequency difference, i.e. the gas influx and therewith the plasma impedance is varied such that the reference frequency is adjusted.

The medium frequency generator 35 fundamentally and always oscillates at the resonance frequency of the output of the oscillator circuit, network and plasma impedance. Since all elements in resonance circuit and network are fixed the resonance frequency depends only on the plasma impedance. Regulated is the plasma impedance and not the frequency. The frequency only represents an indirect instantaneous value for the impedance, i.e. if the impedance is changed via the manipulated variables power, current and voltage and/or gas flow, thus is the instantaneous value of the resonance frequency also changed.

Figure 2:
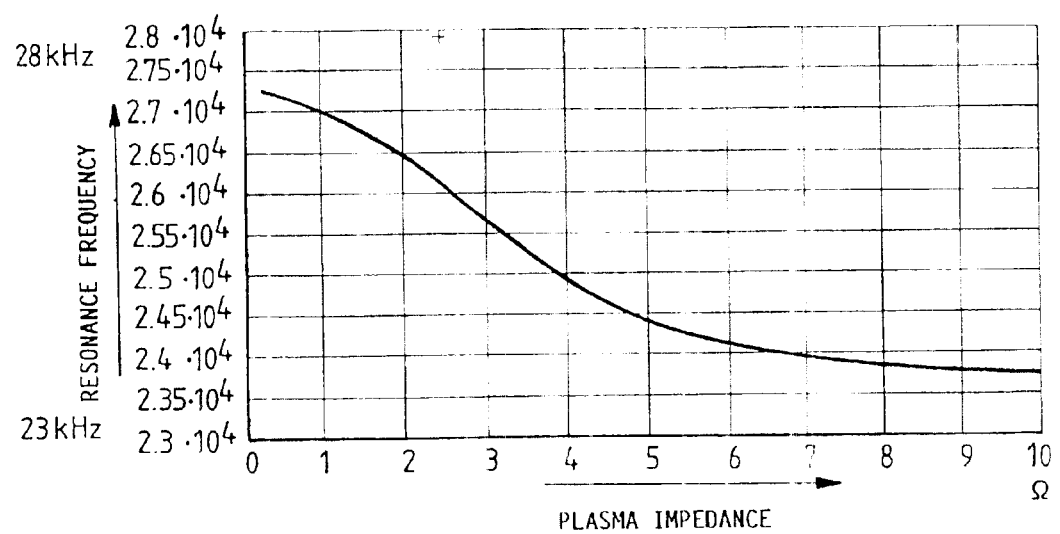
FIG. 2 is a characteristic representation which shows the correlation between plasma impedance and resonance frequency.

In FIG. 2 the characteristic is depicted, which shows the correlation between the plasma impedance and the frequency. It is evident that the plasma impedance at a resonance frequency of $2.75*10^4$ Hz is relatively low and at a resonance frequency of $2.3*10^4$ Hz relatively high. In order to maintain the resonance frequency constant at $2.5*10^4$ Hz, the plasma impedance must be kept at approximately 4 Ω. If the plasma impedance varies, thus through the regulation of the gas inflow is the plasma impedance brought again to its earlier value.

Figure 3:
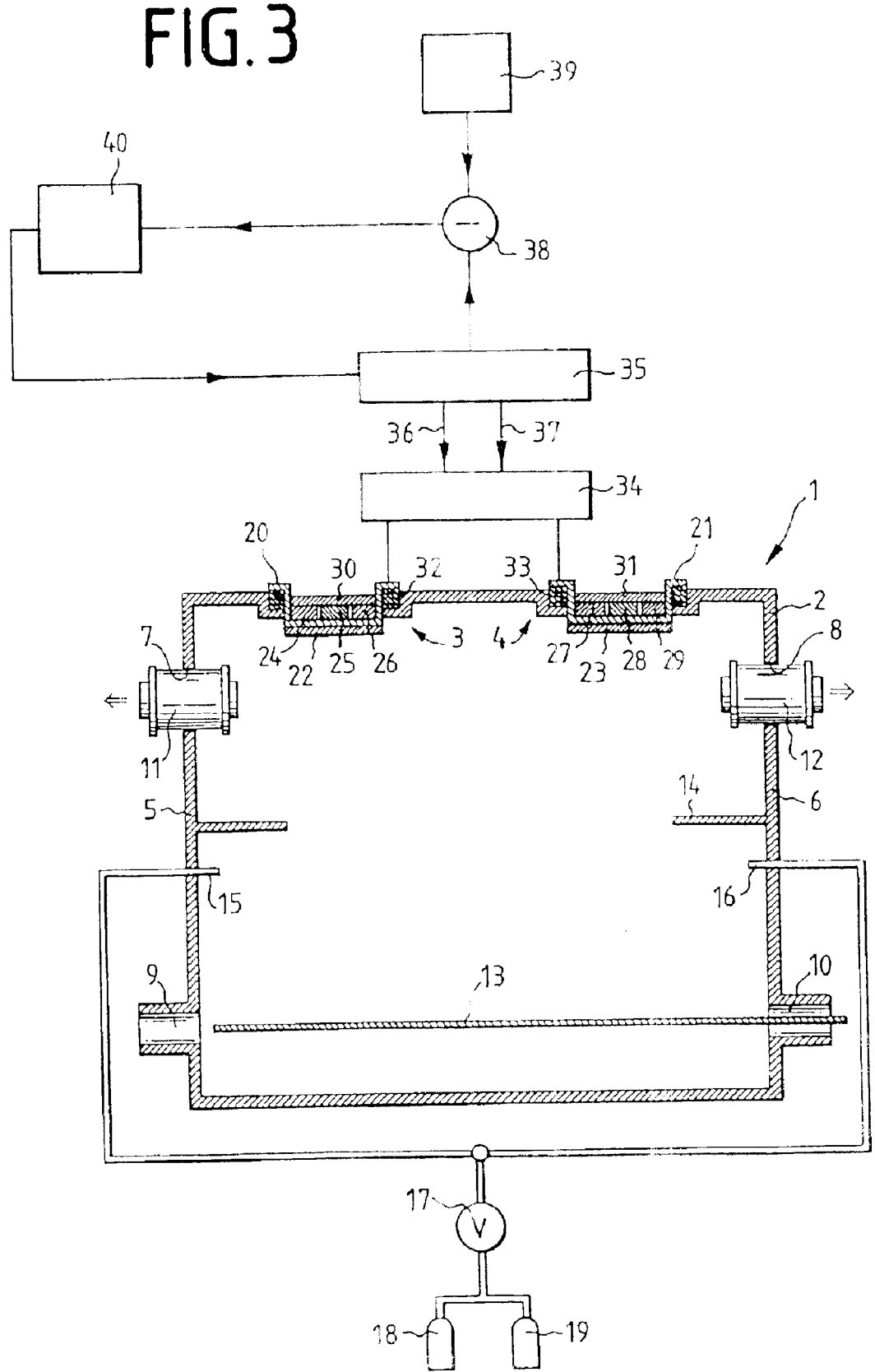
FIG. 3 is a second embodiment of the invention, in which the impedance is regulated by controlling the voltage, the current and/or the power.

FIG. 3 depicts an embodiment of the invention, in which not the inflow of the process or reactive gas is regulated but rather the electric power of the medium frequency generator. For the plasma impedance does not only depend on the gas inflow but also on other parameters such as current, voltage and power, a magnetic field permeating the plasma, UV radiation irradiating the plasma, the gas composition or the accumulation of the target surface with reactive gas fractions.

The principle of regulation according to the embodiment example after FIG. 3 is the same as in the embodiment example after FIG. 1. If the resonance frequency deviates from its reference value, the electric power supplied to the magnetrons 3, 4 is increased or decreased until the reference value of the resonance frequency has adjusted.

In the above described embodiment example in each instance one process variable—the gas inflow or the electric power was regulated. However, it is also possible to regulate several process variables in combination. It is only essential that the regulation processes bring the instantaneous frequency of the free-running medium frequency generator to the reference frequency.

Instead of two cathodes, as shown in FIGS. 1 and 3, the invention can also be realized with only one cathode. The plasma path in this case does not develop between the two cathodes, but rather between the cathode and an anode. The anode can herein be formed by the vacuum chamber 2 or by an insulated electrode suspended in the vacuum chamber 2. The operating point to be set depends on the requirements which are made of the layer deposited on the substrate 13.

What is claimed is:

1. A device for the regulation of a plasma impedance, comprising:

a vacuum chamber, at least one electrode disposed in said vacuum chamber, said at least one electrode connected to an AC generator, wherein into the vacuum chamber a process gas can be introduced, wherein said AC generator is a free-running AC generator whose frequency adjusts to the resonance frequency of the circuitry connected to it;

a reference frequency value sender;

a parameter regulating device, which as a function of the difference between reference and instantaneous frequency value, regulates a parameter which affects the plasma impedance.

2. A device as claimed in claim 1, wherein said AC generator comprises an AC inverter bridge with control electronics.

3. A device as claimed in claim 1, wherein said at least one electrode is a cathode.

4. A device as claimed in claim 1, further comprising a difference former which ascertains the difference between reference and instantaneous frequency.

5. A device as claimed in claim 1, wherein said regulated parameter is the process gas supply.

6. A device as claimed in claim 1, wherein said regulated parameter is the reactive gas supply.

7. A device as claimed in claim 1, wherein said regulated parameter is the electric power output by the AC generator to the cathode.

8. A method of reactive sputtering comprising generating a plasma comprising a substance to be deposited on a substrate with the device of claim 1 and depositing the substance on the substrate.

* * * * *